United States Patent
Shue et al.

[19]

[11] Patent Number: 6,077,779
[45] Date of Patent: Jun. 20, 2000

[54] MULTI-STEP DEPOSITION TO IMPROVE THE CONFORMALITY OF IONIZED PVD FILMS

[75] Inventors: Shaulin Shue; Mei-Yun Wang, both of Hsinchu, Taiwan

[73] Assignee: Taiwan Semiconductor Manufacturing Company, Hsin-Chu, Taiwan

[21] Appl. No.: 09/083,274

[22] Filed: May 22, 1998

[51] Int. Cl.$^7$ .................................................. H01L 21/44
[52] U.S. Cl. .......................... 438/680; 438/624; 438/627; 438/637; 438/648; 438/643; 438/685
[58] Field of Search ..................................... 438/680, 685, 438/687, 627–629, 637–640, 622–624, 642–644, 648, 656, 653, 666–669

[56] References Cited

U.S. PATENT DOCUMENTS 5,882,399  3/1999  Ngan et al. .............................. 438/648

*Primary Examiner*—Charles Bowers
*Assistant Examiner*—Thanh Nguyen
*Attorney, Agent, or Firm*—George O. Saile; Stephen B. Ackerman

[57] ABSTRACT

Methods are disclosed to provide a low-cost method of producing a refractory liner in submicron vias or trenches applying ionized metal plasma using physical vapor deposition (PVD). The refractory liner is deposited on the bottom and sidewalls of the submicron vias and trenches in a two step PVD, using first high pressure and then low pressure. By selecting adhesion layer and diffusion barrier materials such as tantalum, tantalum nitride or titanium nitride or alloys of these metals a uniform barrier is created which forms a suitable layer around copper metallization.

12 Claims, 2 Drawing Sheets

MULTI-STEP DEPOSITION TO IMPROVE THE CONFORMALITY OF IONIZED PVD FILMS

BACKGROUND OF THE INVENTION

1. Field of the Invention

The invention relates to a method of Physical Vapor Deposition (PVD) as related to submicron integrated circuits on semiconductor wafers, and more particularly to the physical vapor deposition of refractory metals in submicron vias and lines.

2. Description of the Related Art

Copper is one of the promising conductors for next generation ultra large scale integration (ULSI) metallization because of its low resistivity and high resistance to electromigration. However, successful implementation of copper metallization requires a proper choice of adhesion layer/diffusion barrier materials and deposition techniques, passivation layer, and a suitable means of filling vias and trenches with copper. Good bottom coverage has been achieved using ionized PVD techniques. The major drawback of this technique is poor sidewall coverage due to directional ion flux, which is the major concern for a copper barrier layer deposition.

U.S. Pat. No. 5,403,779 (Joshi et al.) shows a method of depositing metal lines using PVD techniques. Conductive lines and vias are created using a combination of both PVD (e.g., evaporation or collimated sputtering) of a low resistivity metal or alloy followed by Chemical Vapor Deposition (CVD) of a refractory metal and subsequent planarization. Collimated sputtering allows for creating a refractory metal liner in an opening in a dielectric which is suitable as a diffusion barrier to copper based metallizations as well as CVD tungsten. Ideally, for faster diffusing metals like copper, liners are created by a two step collimated sputtering process wherein a first layer is deposited under relatively low vacuum pressure where directional deposition dominates (e.g., below 1 mTorr) and a second layer is deposited under relatively high vacuum pressure where scattering deposition dominates (e.g., above 1 mTorr).

U.S. Pat. No. 5,250,465 (Iizuka et al.) discloses producing a semiconductor device having small diameter via holes, particularly not greater than 0.6 microns, for a multilayer interconnection, by a method comprising covering an interlayer film and via holes with a continuous first metal film by a CVD process, and heating and melting by an irradiation of an energy beam a second metal film deposited on the first film by a PVD process, together with the first metal film, to fully fill the via holes with the material from the outside of the holes, to thus form conductive plugs therein.

C. Y. Chang, S. M. Sze, in *ULSI Technology*, by The McGraw-Hill Company, Inc. copyright 1997, pp. 378–387 discusses physical vapor deposition techniques.

SUMMARY OF THE INVENTION

It is an object of the present invention to provide a low-cost method of producing a refractory liner in submicron vias or trenches applying ionized metal plasma using physical vapor deposition (PVD).

Another object of the present invention is to provide a uniform barrier layer around copper or copper alloy metallization.

A further object of the present invention is to improve bottom and sidewall coverage of submicron vias or trenches.

These objects have been achieved by depositing the refractory liner in a two step PVD, using first high pressure and then low pressure and by selecting adhesion layer and diffusion barrier materials such as tantalum, tantalum nitride or titanium nitride or allays of these metals.

DESCRIPTION OF THE PREFERRED EMBODIMENT

Figure 1:
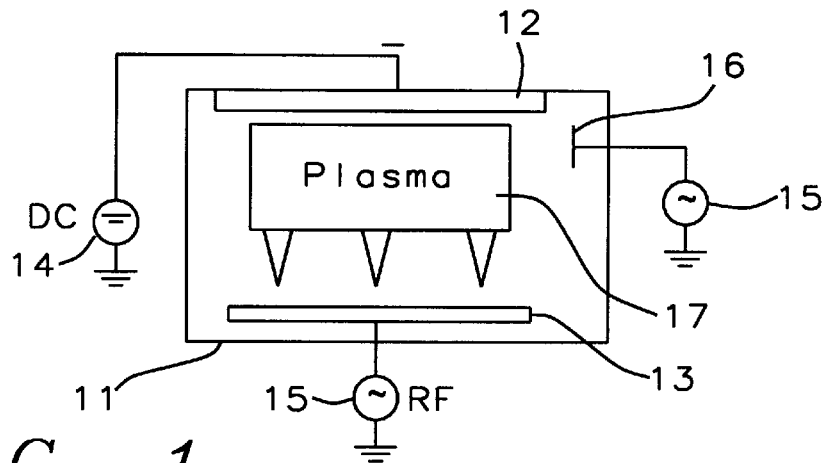
FIG. 1 is a high level block diagram of the principle components of a PVD system as used in the present invention.

Referring now to FIG. 1, we show a high level schematic of a physical vapor deposition system as used in the present invention. Vessel 11 contains a cathode 12 and an anode 13, where the cathode. A DC power source 14 supplies a potential of about 1.5 kV between the cathode (negative) and the anode (positive). In addition a radio-frequency (RF) voltage source 15 is attached to the anode and plate 16. The cathode consists of the target material and the anode is the wafer. When the vessel is evacuated and when power from sources 14 and 15 are applied a plasma 17 develops which causes ionized metal from the target to be deposited on the wafer (anode). The ion Physical Vapor Deposition (PVD) is then modulated by the RF signal 15. A detailed explanation of RF sputtering can be found in S. Wolf and R. N. Tauber, *Silicon Processing for the VLSI Era*, Volume 1, by Lattice Press, copyright 1986, pp 348–353.

Figure 2:
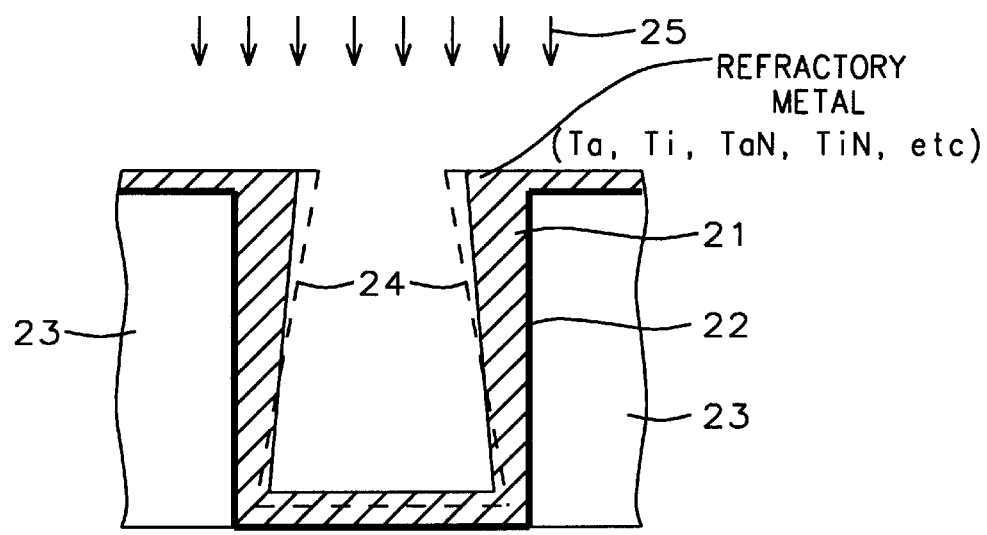
FIG. 2 is a schematic cross sectional side view of a via hole showing a conformal liner deposited using the two step PVD process of the present invention.

Referring now to FIG. 2, we describe the method of the invention in creating a liner in high-aspect ratio submicron vias and trenches, by first sputtering a refractory metal or alloy 21 into high-aspect ratio submicron vias 22 or trenches in a dielectric 23 at a high pressure followed by a second sputtering of a refractory metal or alloy 24 into the same high-aspect ratio submicron vias 22 or trenches at a low pressure. The sputtering of the refractory metal or alloy is achieved using ion physical vapor deposition as already described above. Ion flow from the cathode or target to the anode or wafer is depicted schematically as downward pointing vertical arrows 25. The high aspect ratio submicron vias have a height to diameter ratio of at least 2:1, the high aspect ratio submicron trenches have a height to width ratio of at least 2:1.

The high pressure sputtering is in the range of 20 mTorr to 45 mTorr while the low pressure sputtering is in the range of 5 mTorr to 10 mTorr. Scattering deposition dominates when using high pressure sputtering and favors deposition of ion flux on the bottom of the vias or trenches, whereas directional deposition of the material dominates during low pressure sputtering and favors deposition of ion flux on the sidewalls of the vias or trenches.

The refractory metals or alloys used for creating the liner include Tantalum, Tantalum alloys, Titanium alloys, Tantalum Nitride or Titanium Nitride. The sputtering of refractory metal or alloy using both a high pressure and a low pressure ion PVD creates both an adhesion layer and diffusion barrier. It is understood by those skilled in the art that other materials not listed may also be suitable for providing an adhesion layer and a diffusion barrier to copper and copper alloys.

The advantage of sputtering refractory metals or alloys using both a high pressure and a low pressure ion PVD is that it produces a uniform barrier layer conforming to the sidewalls and bottom of the vias or trenches and at the same time improves bottom and sidewall coverage of the vias or trenches. Another advantage is that deposition of both layers can be done in one run, since it is only necessary to change the pressure in the PVD reaction chamber from a high pressure in the range of 20 mTorr to 45 mTorr to a low pressure in the range from 5 mTorr to 10 mTorr.

Figure 3:
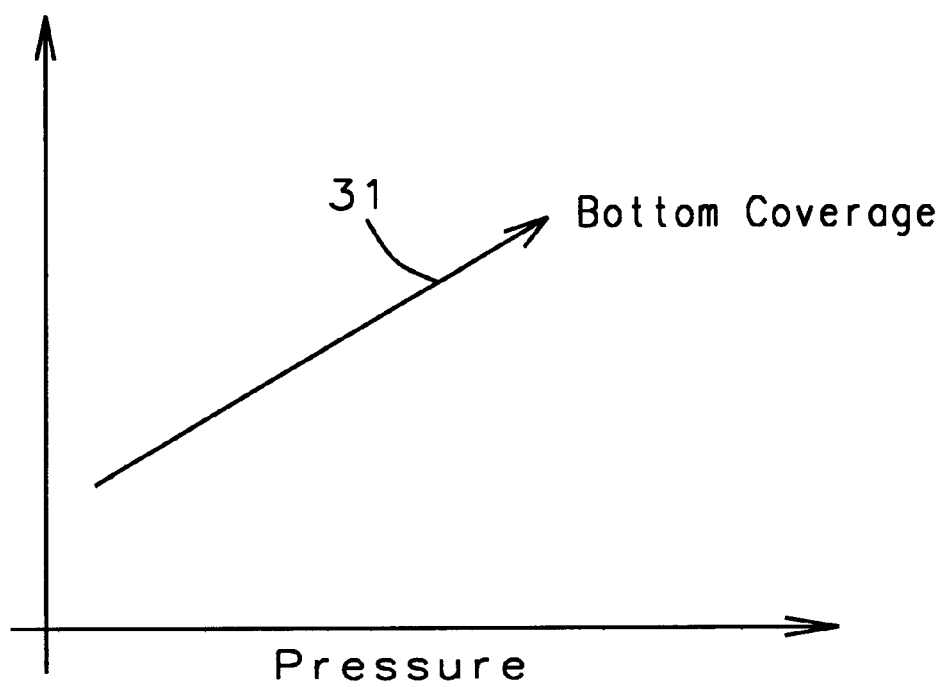
FIG. 3 is a graph showing the relationship of bottom coverage and film stress of a conformal via hole liner versus pressure in a PVD vessel.

Curve 31 of FIG. 3 shows a quantitative relationship between bottom coverage of the vias or trenches with respect to pressure in the PVD vessel. Bottom coverage rises as pressure goes up.

The present invention of using a two-step process of high pressure followed by low pressure PVD has the dual advantage of needing only the PVD process to achieve a uniform adhesion/barrier layer and is achieving this at reduced processing cost since it is a simple matter of changing from a high PVD pressure to a low PVD pressure during sputtering.

While the invention has been particularly shown and described with reference to the preferred embodiments thereof, it will be understood by those skilled in the art that various changes in form and details may be made without departing from the spirit and scope of the invention.

What is claimed is:

1. A method of creating a liner in submicron vias and trenches, having high-aspect ratios of at least 2:1, comprising the steps of:

sputtering at high pressure a refractory metal or alloy into said high-aspect ratio submicron vias or trenches in a dielectric, said high pressure ranging from 20 mTorr to 45 mTorr; and while sputtering continues in the same run, sputtering at low pressure said refractory metal or alloy into said high-aspect ratio submicron vias or trenches in said dielectric, said low pressure ranging from 5 mTorr to 10 mTorr.

2. The method of claim 1, wherein said sputtering of said refractory metal or alloy is achieved using ion physical vapor deposition.

3. The method of claim 1, wherein scattering deposition dominates when using said high pressure sputtering.

4. The method of claim 1, wherein directional deposition dominates when using said low pressure sputtering.

5. The method of claim 2, wherein said ion physical vapor deposition is modulated by a radio-frequency (RF) alternating potential.

6. The method of claim 3, wherein said scattering deposition favors deposition of ion flux on a bottom of said vias or said trenches.

7. The method of claim 4, wherein said directional deposition favors deposition of ion flux on sidewalls of said vias or said trenches.

8. The method of claim 1, wherein said refractory metal or alloy comprises Tantalum, Tantalum alloy, Titanium alloy, Tantalum Nitride, or Titanium Nitride.

9. The method of claim 1, wherein said sputtering of said refractory metal or alloy using both said high pressure and said low pressure ion physical vapor deposition creates an adhesion layer and diffusion barrier on a bottom and sidewalls of said vias and said trenches.

10. The method of claim 9, wherein said sputtering of said refractory metal or alloy using both said high pressure and said low pressure ion physical vapor deposition produces a uniform barrier layer conforming to said sidewalls and said bottom.

11. The method of claim 9, wherein said sputtering of said refractory metal or alloy using both a high pressure and a low pressure ion physical vapor deposition improves coverage of said barrier layer of said bottom and of said sidewalls at the same time.

12. The method of claim 9, wherein said diffusion barrier prevents diffusion of copper and alloys thereof into said dielectric.

* * * * *